United States Patent
Sharon et al.

(10) Patent No.: US 9,865,360 B2
(45) Date of Patent: Jan. 9, 2018

(54) BURN-IN MEMORY TESTING

(71) Applicant: SANDISK TECHNOLOGIES INC., Plano, TX (US)

(72) Inventors: Eran Sharon, Rishon Lezion (IL); Alexander Bazarsky, Holon (IL); Ariel Navon, Revava (IL); Alon Eyal, Zichron Yaakov (IL); Idan Alrod, Herzliya (IL); Ofer Shapira, Herzliya (IL)

(73) Assignee: SanDisk Technologies LLC, Plano, TX (US)

( * ) Notice: Subject to any disclaimer, the term of this patent is extended or adjusted under 35 U.S.C. 154(b) by 104 days.

(21) Appl. No.: 14/920,696

(22) Filed: Oct. 22, 2015

(65) Prior Publication Data

US 2017/0117061 A1    Apr. 27, 2017

(51) Int. Cl.
- *G11C 29/00* (2006.01)
- *G11C 29/38* (2006.01)
- *G11C 29/44* (2006.01)

(52) U.S. Cl.
CPC .............. *G11C 29/38* (2013.01); *G11C 29/44* (2013.01)

(58) Field of Classification Search
CPC ........... G11C 29/38; G11C 29/44; G11C 5/06; G11C 29/12005; G11C 29/18; G11C 11/1697; G11C 16/10; G11C 29/08; G11C 11/1675; G11C 11/16; G11C 13/00; G11C 2029/1802; G11C 8/10; G11C 8/12; G11C 29/34; G11C 8/08; G11C 29/10; G11C 29/06; G11C 2029/0405

See application file for complete search history.

(56) References Cited

U.S. PATENT DOCUMENTS

| | | | | |
|---|---|---|---|---|
| 5,995,427 | A * | 11/1999 | Tsukikawa | G11C 29/50 365/201 |
| 6,198,663 | B1 * | 3/2001 | Takizawa | G06F 11/24 365/185.29 |
| 7,873,885 | B1 * | 1/2011 | Shin | G11C 29/08 365/185.33 |
| 8,667,345 | B2 | 3/2014 | Chang et al. | |
| 2002/0009006 | A1 | 1/2002 | Saitoh et al. | |
| 2002/0061606 | A1 * | 5/2002 | Honma | G01R 31/318511 438/14 |
| 2002/0161963 | A1 * | 10/2002 | Kamimura | G11C 29/14 711/103 |
| 2006/0253750 | A1 | 11/2006 | Kondou | |
| 2006/0273809 | A1 * | 12/2006 | Miller | G01R 31/2889 324/750.05 |
| 2006/0291307 | A1 * | 12/2006 | Fujioka | G11C 29/10 365/201 |

(Continued)

*Primary Examiner* — Guerrier Merant
(74) *Attorney, Agent, or Firm* — Toler Law Group, PC

(57) ABSTRACT

A method performed by a controller includes initiating a first data write operation and an erase operation on a portion of a non-volatile memory. The first data write operation corresponds to a first write resolution. The method includes initiating a second data write operation to write test data to the portion of the non-volatile memory. The second data write operation corresponds to a second write resolution that is greater than the first write resolution. The method also includes reading a representation of the test data from the portion of the non-volatile memory.

42 Claims, 8 Drawing Sheets

(56) References Cited

U.S. PATENT DOCUMENTS

| | | | | |
|---|---|---|---|---|
| 2010/0142289 A1* | 6/2010 | Oku | ............... | G11C 5/145 |
| | | | | 365/189.09 |
| 2013/0039139 A1* | 2/2013 | Raval | ............... | G11C 29/06 |
| | | | | 365/201 |
| 2013/0064015 A1* | 3/2013 | Tailliet | ............... | G11C 29/06 |
| | | | | 365/185.18 |
| 2013/0148405 A1* | 6/2013 | Kang | ............... | G11C 5/06 |
| | | | | 365/148 |
| 2013/0308402 A1* | 11/2013 | Mu | ............... | G11C 29/50004 |
| | | | | 365/201 |
| 2015/0364215 A1* | 12/2015 | Frayer | ............... | G11C 29/10 |
| | | | | 365/185.05 |

\* cited by examiner

BURN-IN MEMORY TESTING

FIELD OF THE DISCLOSURE

This disclosure is generally related to burn-in testing of memory devices.

BACKGROUND

Non-volatile storage devices, such as flash memory devices, have enabled increased portability of data and software applications. For example, flash memory devices can enhance data storage density by storing multiple bits in each flash memory cell. To illustrate, Multi-Level Cell (MLC) flash memory devices provide increased storage density by storing 3 bits per cell, 4 bits per cell, or more. Electronic devices, such as mobile phones, typically use non-volatile storage devices, such as flash memory devices, for persistent storage of information, such as data and program code that is used by the electronic device. Advances in technology have resulted in increased storage capacities of non-volatile storage devices with reductions in storage device size and cost.

Although fabrication techniques continue to improve for such memory devices, occasionally a memory device is fabricated with a component that becomes non-functional early within the life of the memory device, such as due to fabrication irregularities. These memory devices may be identified via "burn-in" testing that includes performing a relatively small number of data write and erase operations to sections of the memory, followed by a data integrity check. Burn-in testing may be performed at a memory tester that also performs other testing (e.g., leakage testing or testing of latches or sense amplifiers). However, because such memory testers can be relatively expensive and may be configured to test a single memory device at a time, burn-in testers are typically used to perform burn-in testing on multiple memory devices at the same time. Although a higher test throughput may be achieved using a burn-in tester as compared to performing burn-in testing using a memory tester, connecting and disconnecting each memory device to two different testers (e.g., the memory tester and the burn-in tester) introduces additional delay and cost.

DETAILED DESCRIPTION

Particular aspects of the present disclosure are described below with reference to the drawings. In the description, common features are designated by common reference numbers. Although certain examples are described herein with reference to a data storage device, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more other conditions or events not explicitly recited. As used herein, "examplary" may indicate an example, an implementation, and/or an aspect, and should not be construed as limiting or as indicating a preference or a preferred example, implementation, and/or aspect.

The present disclosure describes systems and methods of performing burn-in testing with improved efficiency. Burn-in data write operations are performed using a lower resolution for increased speed as compared to data write operations for long-term data storage. The burn-in data may be repeatedly written to and erased from a memory device to trigger early stage failures for marginal components of the memory device. After a burn-in write/erase cycle has completed on a portion of the memory device, a higher-resolution data write operation may be used to test for component failure at the portion of the memory device. The increased speed of burn-in testing as described herein may increase a cost-effectiveness of performing burn-in testing on a memory tester. Alternatively, the increased speed of burn-in testing as described herein may enable "in the field" testing by a controller of the memory device to be performed without causing an unacceptable delay for a user of the memory device.

Figure 1:
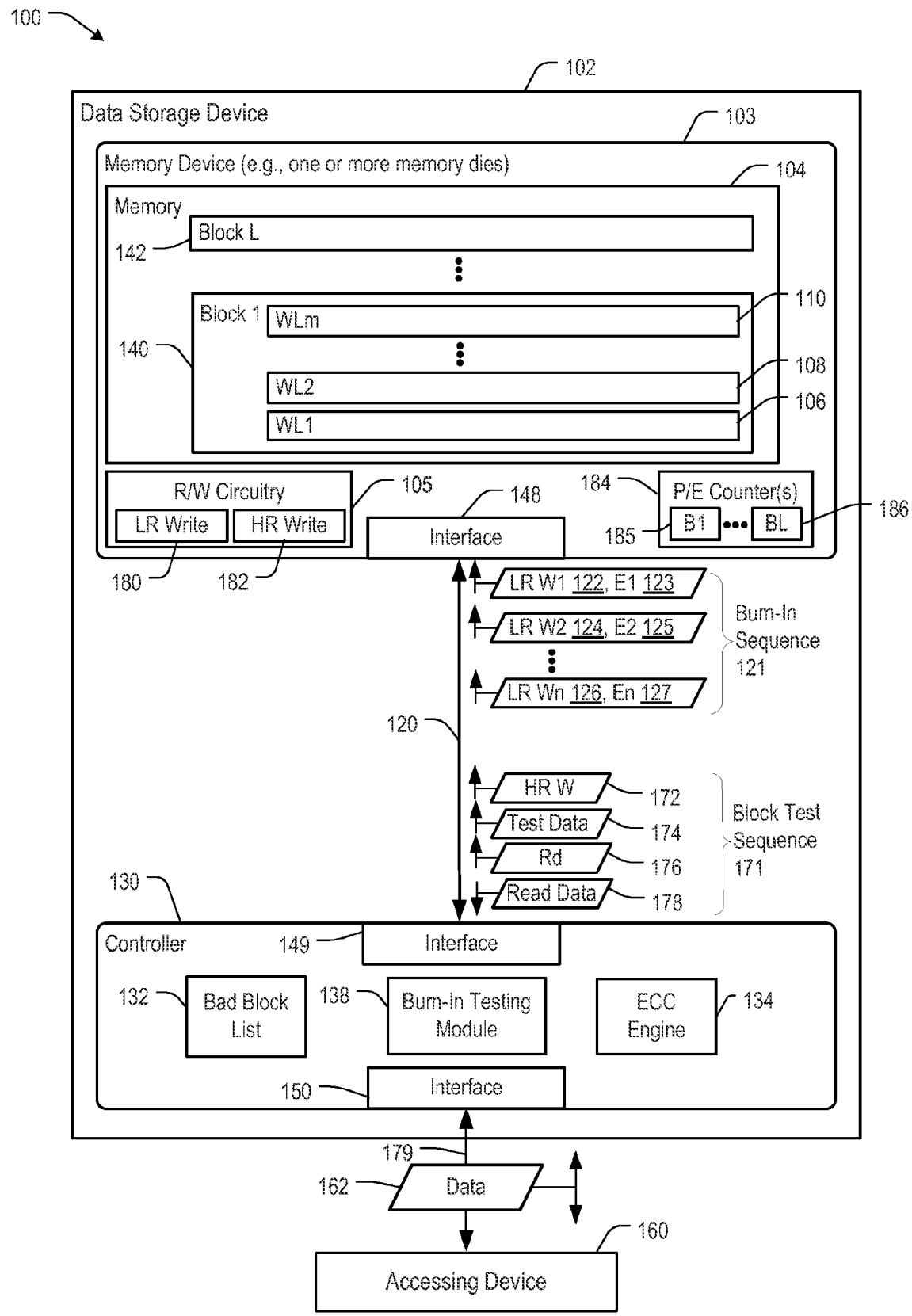
FIG. 1 is a block diagram of a particular illustrative example of a system including a data storage device configured to perform burn-in memory testing.

FIG. 1 depicts an illustrative example of a system 100 that includes a data storage device 102 and an accessing device 160. The data storage device 102 includes a controller 130 (e.g., a memory controller) and a memory device 103 that is coupled to the controller 130. The memory device 103 may include one or more memory dies.

The data storage device 102 and the accessing device 160 may be coupled via a connection (e.g., a communication path 179), such as a bus or a wireless connection. The data storage device 102 may include a first interface 150 (e.g., an accessing device interface) that enables communication via the communication path 179 between the data storage device 102 and the accessing device 160.

In some implementations, the data storage device 102 may be embedded within the accessing device 160, such as in accordance with a Joint Electron Devices Engineering Council (JEDEC) Solid State Technology Association Universal Flash Storage (UFS) configuration. For example, the data storage device 102 may be configured to be coupled to the accessing device 160 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the accessing device 160 (i.e., "removably" coupled to the accessing device 160). As an example, the data storage device 102 may be removably coupled to the accessing device 160 in accordance with a removable universal serial bus (USB) configuration.

In some implementations, the data storage device 102 may include or correspond to a solid state drive (SSD) which may be included in, or distinct from (and accessible to), the accessing device 160. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the accessing device 160 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In some implementations, the data storage device 102 and the accessing device 160 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples.

The accessing device 160 may include a memory interface (not shown) and may be configured to communicate with the data storage device 102 via the memory interface to read data from and write data to the memory device 103 of the data storage device 102. For example, the accessing device 160 may operate in compliance with a Joint Electron Devices Engineering Council (JEDEC) industry specification, such as a Universal Flash Storage (UFS) Access Controller Interface specification. As other examples, the accessing device 160 may operate in compliance with one or more other specifications, such as a Secure Digital (SD) Access Controller specification, as an illustrative, non-limiting example. The accessing device 160 may communicate with the memory device 103 in accordance with any other suitable communication protocol.

The accessing device 160 may include a processor and a memory. The memory may be configured to store data and/or instructions that may be executable by the processor. The memory may be a single memory or may include multiple memories, such as one or more non-volatile memories, one or more volatile memories, or a combination thereof. The accessing device 160 may issue one or more commands to the data storage device 102, such as one or more requests to erase data, to read data from, or to write data to the memory device 103 of the data storage device 102. For example, the accessing device 160 may be configured to provide data, such as data 162, to be stored at the memory device 103 or to request data to be read from the memory device 103. The accessing device 160 may include a mobile telephone, a computer (e.g., a laptop, a tablet, or a notebook computer), a music player, a video player, a gaming device or console, an electronic book reader, a personal digital assistant (PDA), a portable navigation device, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include "L" blocks (e.g., L is an integer greater than one), including a first block (block 1) 140 up to an $L^{th}$ block (block L) 142. For example, each of the blocks 140-142 may include a NAND flash erase block, multiple erase blocks, or any other erasable portion of the memory 104. To illustrate, the memory 104 may include at least one block of storage elements (e.g., also referred to herein as memory cells). Each storage element of the memory 104 may be programmable to a state (e.g., a threshold voltage in a flash configuration or a resistive state in a resistive memory configuration) that indicates one or more values. Each block 140-142 of the memory 104 may include one or more word lines (e.g., "m" word lines, where m is an integer greater than one), such as a first word line (WL1) 106, a second word line (WL2) 108, up to an $m^{th}$ word line (WLm) 110. Although the memory 104 is illustrated as having three word lines, in other implementations, the memory 104 may include more than three word lines or fewer than three word lines. Each word line may include one or more pages, such as one or more physical pages. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write (R/W) circuitry 105, to support operation of one or more memory dies of the memory device 103. The R/W circuitry 105 may include first circuitry 180 configured to enable write operations at the memory 104 using a first write resolution. The R/W circuitry 105 may also include second circuitry 182 configured to enable write operations at the memory 104 using a second write resolution. To illustrate, the read/write circuitry 105 may be configured to perform a first data write operation corresponding to the first write resolution and to perform a second data write operation corresponding to the second write resolution. For example, the first data write operation may include a first number of programming phases, and the second data write operation may include a second number of programming phases that is greater than the first number. As another example, the first data write operation may include a first number of verify stages, and the second data write operation may include a second number of verify stages that is greater than the first number. In some implementations, the first number of verify stages is zero. As other examples, the first data write operation may include at least one of: fewer programming pulses than the second data write operation, a higher programming voltage than the second data write operation, or a larger programming pulse voltage step size than the second data write operation. Examples of programming phases, verify stages, programming pulses, programming voltages, and programming pulse voltage step sizes are described in further detail with respect to FIG. 4. The first resolution may be a "lower resolution" than the second resolution in that a data write operation using the first resolution may result in a first cell voltage distribution (CVD) of storage elements having "wider" lobes (e.g., lobes spanning larger voltage ranges) as compared to "narrower" lobes of a second CVD resulting from a data write operation using the second resolution. Examples of CVDs corresponding to the first resolution and the second resolution are described in further detail with respect to FIG. 4.

In some implementations, the R/W circuitry 105 may be configured to perform the first data write operation by programming individual word lines sequentially, such as by performing a low-resolution write to the first word line 106, then performing a low-resolution write to the second word line 108, etc., until all of the word lines 106-110 in the first block 140 are programmed. In other implementations, the first data write operation may program storage elements coupled to multiple word lines in an erase block concurrently. For example, the R/W circuitry 105 may apply biases to all bit lines and all word lines in the first block 140 simultaneously to cause all storage elements in the first block 140 to be programmed at the same time.

Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The memory device 103 includes program/erase (P/E) counters 184. The P/E counters 184 may be configured to indicate a number of program (e.g., data write) operations or erase operations that have been performed on portions of the memory 104. The P/E counters 184 may count program and/or erase cycles for each of the blocks 140-142 of the memory 104, such as a first P/E counter 185 corresponding to the first block 140 and an $L^{th}$ counter 186 corresponding to the $L^{th}$ block 142. The P/E counters 184 may include counter circuitry and/or may include data values stored at a non-volatile memory, such as in the memory 104.

The memory device 103 also includes a controller interface 148 coupled via a bus 120 to a memory interface 149 of the controller 130. For example, the bus 120 may include one or more channels to enable the controller 130 to communicate with a single memory die of the memory device 103. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the accessing device 160 and to send data to the accessing device 160. For example, the controller 130 may send data to the accessing device 160 via the first interface 150, and the controller 130 may receive data from the accessing device 160 via the first interface 150. The controller 130 is configured to send data and commands to the memory 104 and to receive data from the memory 104. For example, the controller 130 is configured to send data and a write command to cause the memory 104 to store data to an address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The controller 130 also includes a bad block list 132, an error correction code (ECC) engine 134, and a burn-in testing module 138. The bad block list 132 is configured to store indications of erase blocks of the memory device 103 that are to be unused. The ECC engine 134 may include an encoder configured to encode one or more data words using an ECC encoding technique. The ECC engine 134 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples. The ECC engine 134 may include a decoder configured to decode data read from the memory 104 to detect and correct, up to an error correction capability of the ECC scheme, bit errors that may be present in the data.

The controller 130 is configured to initiate a memory initialization test by sending a first write command 122 that causes a first data write operation having a first resolution (e.g., a "low-resolution" ("LR") write operation using the first circuitry 180) to be performed on a portion of the memory 104, such as at one or more of the word lines 106-110 of the first block 140. In some implementations, the memory device 103 includes control circuitry configured to perform at least one memory access operation in response to receiving a burn-in test command (e.g., the first write command 122), such as described in further detail with respect to FIG. 3. For example, the first write command 122 may include a single command generated by the burn-in testing module 138 that causes the R/W circuitry 105 to use the first circuitry 180 to program first data to storage elements coupled the first word line 106, second data to storage elements coupled to the second word line 108, etc., up to $m^{th}$ data programmed to storage elements of the $m^{th}$ word line 110. As another example, the first write command 122 may include a command that causes the R/W circuitry 105 to use the first circuitry 180 to program data into storage elements of multiple word lines simultaneously in a manner similar to an erase operation, such as by applying a programming pulse simultaneously to all of the word lines 106-110 at the first block 140. Alternatively, the first write command 122 may include a series of individual write commands to write data to storage elements of individual word lines 106-110.

After sending the first write command 122 to cause a low-resolution write operation to be performed using the first circuitry 180 for burn-in testing, the controller 130 is configured to send a first erase command 123 generated by the burn-in testing module 138 to erase the portion of the memory 104, such as by erasing the first block 140. After the first block 140 is erased, the first P/E counter 185 may be incremented. Because data is written to the portion of the memory 104 for burn-in testing and may be erased prior to being read from the memory 104, the data may be written at a higher speed and with a lower resolution (e.g., allowing more bit errors) as compared to data that is written to the memory 104 for storage.

After performing the low-resolution write operation and erase operation on a portion of the memory 104, the controller 130 may test the portion of the memory to determine if the burn-in test impaired performance of the portion of the memory 104. For example, the controller 130 may be configured to initiate a second data write operation by sending a second write command 172 generated by the burn-in testing module 138 to cause a second write operation having a second resolution that is greater than the first resolution (e.g., a "high-resolution" ("HR") write operation using the second circuitry 182) to write test data 174, such as an ECC codeword, to the portion of the memory 104. Example implementations of the first and second write operations are described in further detail with respect to FIG. 4. The controller 130 may be configured to send a read command 176 to read a representation 178 of the test data 174 from the portion of the memory 104. The representation 178 may match the test data 174 or may differ from the test data 174 due to one or more bit errors. The controller 130 may be configured to provide the representation 178 of the test data 174 to the ECC engine 134 to determine a number of errors in the representation 178 of the test data 174.

The burn-in testing module 138 may be configured to generate commands to perform multiple write operations having the first write resolution at the portion of the memory 104 before initiating the second data write operation. For example, the burn-in testing module 138 may be configured to generate the first write command 122 and the first erase command 123 as part of a burn-in test sequence 121. To illustrate, the controller 130 may be configured to cause the burn-in testing module 138 to initiate the burn-in test sequence 121 in response to detecting a first-time mount of the data storage device 102. After the operations of the burn-in test sequence 121 have been performed with respect to a particular block of the memory 104, the burn-in testing module 138 may be configured to generate the second write command 172 and then read the representation 178 of the test data 174 from the particular block as part of a block test sequence 171.

The controller 130 may be configured to add an indicator of the first block 140 to the bad block list 132 at least partially based on a number of errors in the representation 178 of the test data 174 read from the first block 140. To illustrate, error rate data corresponding to the representation 178 of the test data 174 read from the first word line 106 may be combined (e.g., summed or averaged) with error rate data corresponding to test data read from other word lines of the first block 140. The resulting combined error rate data may be compared to a threshold to determine whether the first block 140 is to be marked for non-use in the bad block list 132.

During operation, the controller 130 may detect a first-time mount of the data storage device 102. For example, the controller 130 may read a flag value upon power-up to determine whether a first-time mount of the data storage device 102 has been completed. If the flag (e.g., in the memory 104 or in a non-volatile memory of the controller 130, such as a fuse or one-time programmable memory) indicates that a first-time mount of the data storage device 102 has not been completed, the controller 130 may cause the burn-in testing module 138 to initiate a burn-in test of the memory 104 and may change a value of the flag to indicate that the first-time mount has been completed.

The burn-in testing module 138 may perform burn-in testing on one or more blocks of the memory device 103. For example, the burn-in testing module 138 may perform the burn-in sequence 121 and the block test sequence 171 on each block of each die of the memory device 103. Each tested block may be evaluated at least partially based on how well the block stores data after the burn-in sequence is performed.

To illustrate, the burn-in testing module 138 may initiate a burn-in testing operation on the first block 140 by generating the first write command 122 to cause the first data write operation on the first block 140. After the first data write operation, the burn-in testing module 138 may generate the first erase command 123 to erase the first block 140 (e.g., the data is erased at the first block 140 without the data being read from the first block 140). In response to the first data write operation and the first erase operation, the P/E counter 185 for the first block 140 may be incremented.

The burn-in testing module 138 may continue generating commands of the burn-in sequence 121 for the first block 140, including a second write command 124 to write data using the first resolution at the first block 140 and a second erase command 125 to erase the first block 140. The burn-in sequence 121 may include one or more commands to program and erase the first block, up to an $n^{th}$ data write command 126 and an $n^{th}$ erase command 127. After completion of the $n^{th}$ erase operation, the P/E counter 185 for the first block 140 may indicate that 'n' P/E cycles have been performed on the first block 140.

After the burn-in sequence 121 is performed on the first block 140, the burn-in testing module 138 may initiate the block test sequence 171 by generating the second data write command 172 and the test data 174. The second data write command 172 may cause the second data write operation having the second resolution to write the test data 174 to one or more word lines of the first block 140. After writing the test data 174 to the one or more word lines of the first block 140, the burn-in testing module 138 may generate the read command 176 to read one or more representations of the test data 174 (e.g., the representation 178) from the first block 140. The representations of the test data 174 may be processed by a decoder of the ECC engine 134, such as by fully or partially decoding the representation 178 of the test data 174. Error information generated by the ECC engine 134 may be used by the burn-in testing module 138 to determine whether the first block 140 satisfies the burn-in test or whether the first block 140 is to be unused, such as by adding an indication of the first block 140 to the bad block list 132. After updating the bad block list 132, the controller 130 may store a copy of the bad block list 132 to the memory 104 as a persistent copy that can be read from the memory 104 following a power-down event.

The burn-in testing module 138 may continue with burn-in testing for one or more blocks (or all blocks) of the memory 104, including blocks at one or more dies of the memory device 103, in a manner similar to the burn-in testing for the first block 140. After completion of the burn-in testing, the controller 130 may set a flag to indicate that burn-in testing has been performed for the data storage device 102. After updating the bad block list 132 to indicate blocks identified for non-use (if any), the controller 130 may access the bad block list 132 in response to memory access requests from the accessing device 160 so that blocks that are indicated in the bad block list 132 are not used for storing data.

Although one or more components of the data storage device 102 have been described with respect to the controller 130, in other implementations certain components may be included in the memory device 103 (e.g., the memory 104). Alternatively, or in addition, one or more functions (e.g., generation of data for a low-resolution write of a burn-in test) as described above with reference to the controller 130 may be performed at or by the memory device 103, such as described in further detail with respect to FIG. 3. For example, one or more functions of the burn-in testing module 138 and/or the ECC engine 134 may be performed by components and/or circuitry included in the memory device 103. In other implementations, one or more functions may be performed by another device such as a memory tester, such as described in further detail with respect to FIG. 2.

Alternatively, or in addition, one or more components of the data storage device 102 may be included in the accessing device 160. For example, one or more of the bad block list 132, the burn-in testing module 138, and/or the ECC engine 134 may be included in the accessing device 160. To illustrate, the bad block list 132 may be sent to a RAM of the accessing device 160. Alternatively, or in addition, one or more functions as described above with reference to the controller 130 may be performed at or by the accessing device 160. As an illustrative, non-limiting example, the accessing device 160 may be configured to process data to be written to the memory to form one or more codewords and to initiate writing of the codewords as the test data 174.

Performing burn-in testing by the controller 130 reduces cost and delay associated with performing burn-in testing of the memory 104 at a testing facility using a burn-in memory tester. For example, a fabrication and testing process may include coupling a memory die or wafer to a burn-in tester that performs burn-in testing to the memory die or wafer. By postponing the burn-in testing until the data storage device 102 is "in the field," such as in response to detecting a first-time mount of the data storage device 102, cost and delay associated with use of the burn-in tester may be avoided.

Additionally, performing burn-in testing using the first data write operation having the first resolution enables the burn-in test sequence 121 to be performed in less time and using less power as compared to using data write operations that have the second resolution. A delay associated with performing the burn-in testing at the controller 130 in the field may therefore be reduced as compared to performing burn-in testing using the second resolution. As a result, a user experience associated with the data storage device 102 may be enhanced due to the reduced delay.

Figure 2:
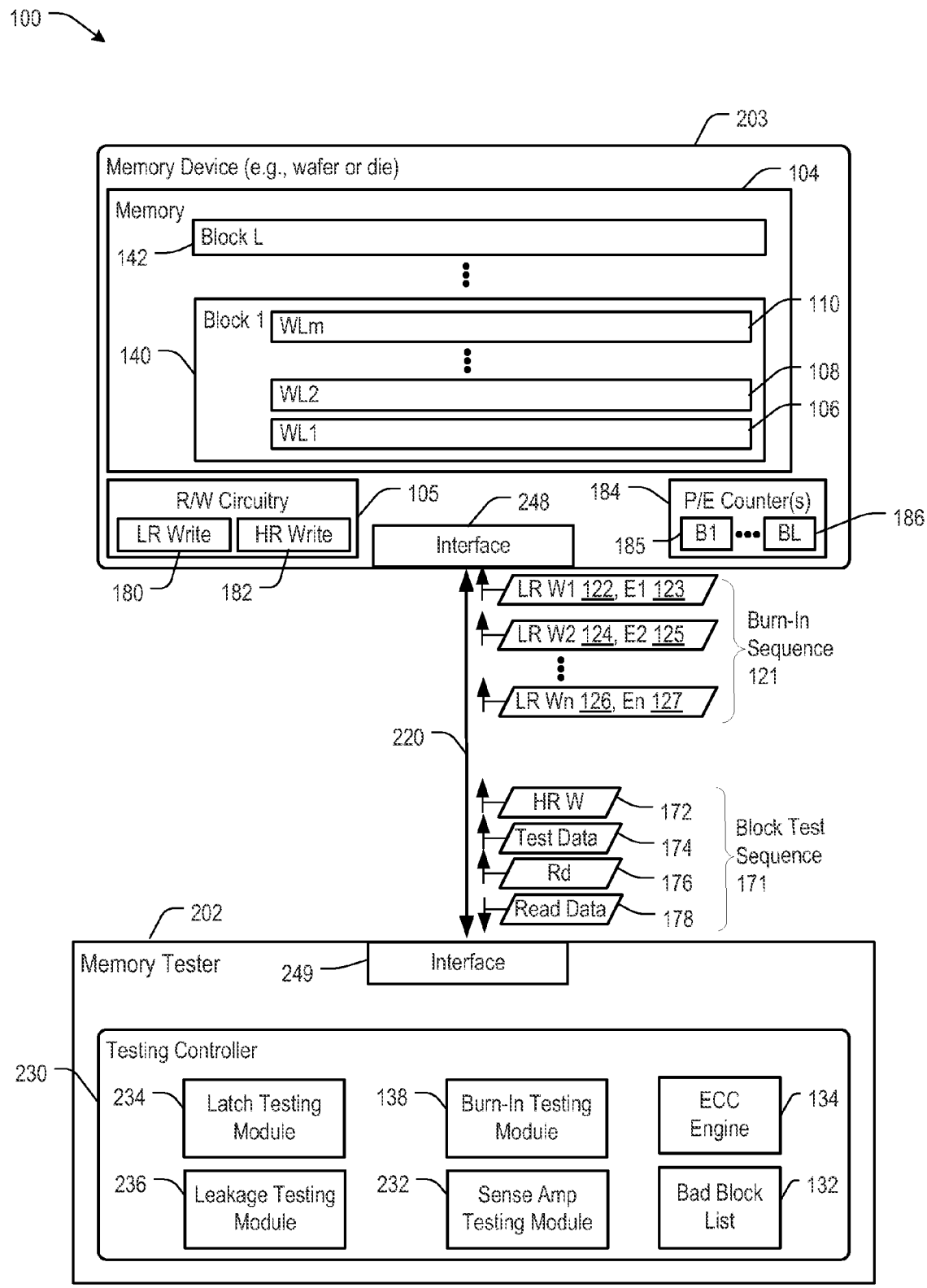
FIG. 2 is a block diagram of a particular illustrative example of a system including a memory tester configured to perform burn-in memory testing.

FIG. 2 depicts an illustrative embodiment of a system 200 that includes a memory tester 202 that includes the burn-in testing module 138 of FIG. 1. The memory tester 202 is configured to be coupled to a memory device 203 and to perform testing of the memory device 203. The memory device 203 may include a die or a wafer that includes a non-volatile memory, illustrated as the memory 104 of FIG. 1. The memory device 203 may also include the P/E counters 184 and the R/W circuitry 105 of FIG. 1.

The memory tester 202 includes a memory interface 249 configured to be coupled to a die or a wafer that includes a non-volatile memory, such as via a memory bus 220 to a controller interface 248 of the memory device 203. For example, the memory bus 220 may correspond to the bus 120 of FIG. 1.

The memory tester 202 also includes a testing controller 230. The testing controller 230 includes multiple testing modules, such as a latch testing module 234, a leakage testing module 236, and a sense amplifier testing module 232. The testing controller 230 may be configured to perform one or more tests of the memory device 203 to verify operation of various components of the memory device 203. For example, the latch testing module 234 may be configured to initiate and verify results of a scan chain test at the memory device 203, the sense amplifier testing module 232 may be configured to initiate and verify results of testing performance of sense amplifiers at the memory device 203, and the leakage testing module 236 may be configured to initiate and verify results of leakage current testing at the memory device 203.

The testing controller 230 also includes the burn-in testing module 138, the ECC engine 134, and the bad block list 132 of FIG. 1. Using the burn-in testing module 138, the testing controller 230 is configured to initiate a memory initialization test that causes a first data write operation and an erase operation to be performed on a portion of the memory 104, to initiate a second data write operation to write test data to the portion of the memory 104, and to read a representation of the test data from the portion of the memory 104. To illustrate, the burn-in testing module 138 may be configured to generate the commands 122-127 of the burn-in sequence 121 to perform multiple write operations corresponding to a first write resolution at the portion of the memory 104 before initiating the block test sequence 171 using the commands 172-178 to perform the second data write operation and to read the representation 178 of the test data 174 from the portion of the memory 104. The testing controller 230 is configured to use the ECC engine 134 to determine a number of errors in the representation 178 of the test data 174 and is configured to add an identifier of an erase block to the bad block list 132 at least partially based on the number of errors.

Although the testing controller 230 is illustrated as including the sense amplifier testing module 232, the latch testing module 234, and the leakage testing module 236, in other implementations the testing controller 230 may omit one or more of the sense amplifier testing module 232, the latch testing module 234, and the leakage testing module 236. Alternatively or in addition, in other implementations the testing controller 230 may include one or more additional testing modules to test operation of one or more other components of the memory device 203.

Because the first write resolution of the first data write operation is lower than the second write resolution of the second data write operation, the burn-in sequence 121 may be performed more quickly than a burn-in sequence that uses a higher write resolution. Performing burn-in testing at the memory tester 202 reduces a cost and delay associated with performing burn-in testing of the memory 104 at a testing facility using a separate burn-in tester.

Figure 3:
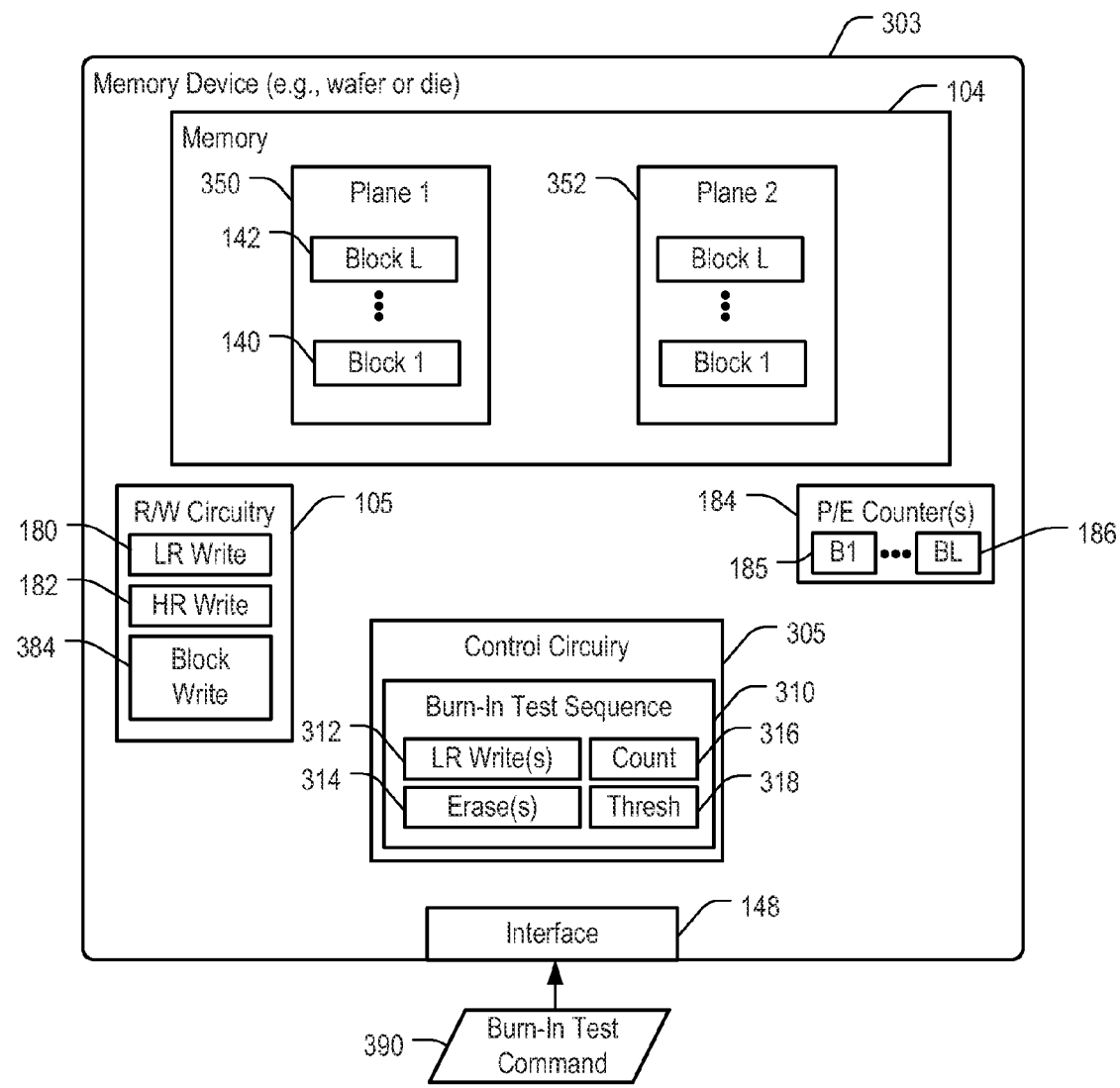
FIG. 3 is a block diagram of a particular illustrative example of a memory device including control circuitry configured to perform burn-in memory testing.

FIG. 3 depicts a particular embodiment of a memory device 303 that is responsive to a burn-in test command 390. For example, the memory device 303 may correspond to the memory device 103 of FIG. 1 or the memory device 203 of FIG. 2. The memory device 303 includes the memory 104, the controller interface 148, the R/W circuitry 105, and the P/E counters 184 of FIG. 1. The memory 104 includes a first plane 350 that includes a first set of erase blocks (blocks 140-142) and a second plane 352 that includes a second set of erase blocks. Although FIG. 3 illustrates two planes, in other implementations the memory 104 may include a single plane or more than two planes.

The memory device 303 includes control circuitry 305 that may be coupled to the controller interface 148 and to the memory 104. The control circuitry 305 is configured to perform at least one memory access operation in response to receiving the burn-in test command 390 from a controller via the controller interface 148. For example, the burn-in test command 390 may be received from the controller 130 of FIG. 1 or from the testing controller 230 of the memory tester 202 of FIG. 2.

In a particular implementation, the control circuitry 305 may include a state machine configured to perform a sequence of write operations and erase operations to a portion of the memory 104 in response to receiving the burn-in test command 390. For example, a single burn-in test command 390 indicating a portion of the memory (e.g., by including a block address of the first block 140) may be received at the memory device 303. In response to receiving the single burn-in test command 390, the control circuitry 305 may initiate a burn-in test sequence 310 that includes repeatedly performing a low-resolution write operation 312 and an erase operation 314 at the indicated portion of the memory until a counter value (e.g., a count 316 or the first P/E counter 185) equals a threshold 318. Thus, the control circuitry 305 may perform a same or similar sequence of memory access operations as part of the burn-in test sequence 310 responsive to the single burn-in test command 390 as would be performed by the memory device 103 in response to receiving the burn-in sequence 121 of FIG. 1.

The control circuitry 305 may be configured to cause the R/W circuitry 105 to perform the at least one memory access operation as a first data write operation corresponding to the first write resolution (e.g., using the first circuitry 180) and to perform a test data write operation corresponding to a second write resolution that is greater than the first write resolution (e.g., using the second circuitry 182). The first data write operation may include a block write operation that programs all storage elements of an erase block simultaneously (or substantially simultaneously). For example, the R/W circuitry 105 may include a block write circuit 384 that is configured to write data to all storage elements of a block simultaneously (or substantially simultaneously). For example, each of the bit lines for a particular block may be charged to a programming voltage, and a programming voltage may be applied to each of the word lines of the particular block simultaneously (or substantially simultaneously) to cause programming of each storage element of the particular block. In some implementations, one or more programming pulses may be applied to program the storage elements in the particular block. The programming pulses may have a higher voltage, longer pulse duration, or a combination thereof, as compared to a higher-resolution data programming operation, as described in further detail with respect to FIG. 4. In such simultaneous programming of all the word lines of the block, a single verify level may be used for all the cells within the block, such that each bit line will be inhibited (to prevent further programming) once the threshold voltages of one of the cells along this bitline has passed the verify level. The verify level may be used to control the level of stress that will be induced to the block during the programming cycle. To illustrate, higher stress may be induced if the verify level is set to a higher voltage (e.g., a stage G verify level, where all cells of the block are to be programmed to a G state threshold voltage level) as compared to lower stress if the verify level is set to a lower voltage (e.g., a state B verify level). Note that such simultaneous programming of all the word lines of the block is a block programming operation which is analogous to a block Erase operation in which all the word lines of a block are simultaneously erased (all cells brought to the Erase state). Simultaneous programming of all of the word lines of a block in a block programming operation is significantly faster (e.g., more than an order of magnitude faster) as compared to a conventional word line-by-word line programming operation. Hence, using the block programming operation may significantly speed up the burn in time.

Figure 4:
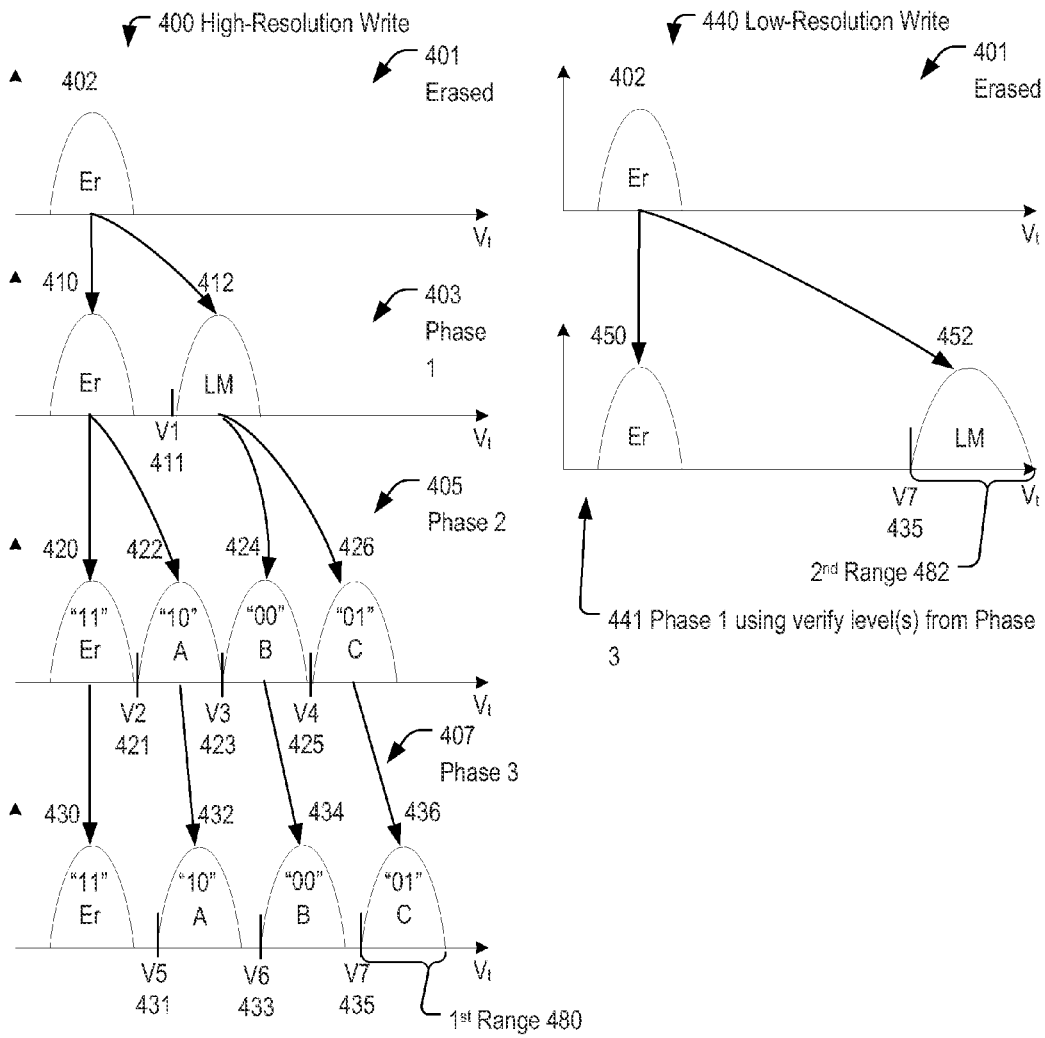
FIG. 4 is a general diagram illustrating various examples of low-resolution write operations that may be used in a burn-in test sequence.
Figure 4:
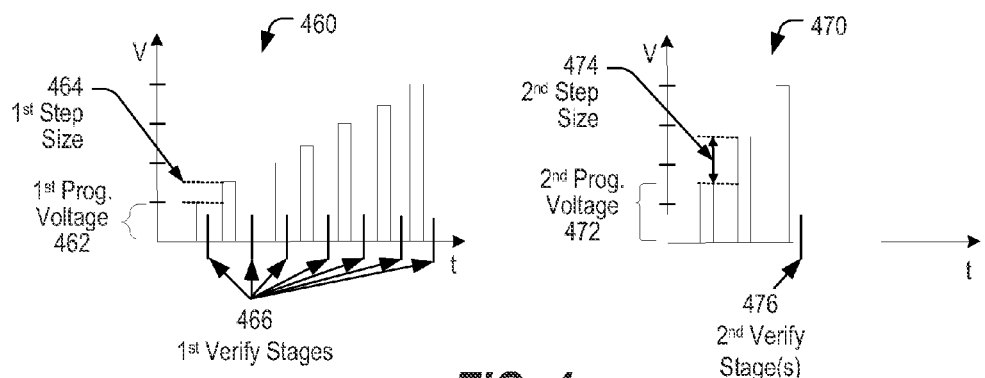

FIG. 4 depicts examples of lower-resolution write operations and higher-resolution write operations that may be used to perform burn-in testing as described with reference to FIGS. 1-3. A first example 400 of a high-resolution write operation is depicted as having three programming phases. Prior to the write operation, storage elements in the portion of the memory may be erased, resulting in a first cell voltage distribution (CVD) 401 of the storage elements having a single lobe 402 corresponding to an erase (Er) state. In the first CVD 401, the horizontal axis represents storage element threshold voltage and the vertical axis represents the number of storage elements (or the percentage of storage elements) having the threshold voltage.

A second CVD 403 illustrates threshold voltages of the storage elements after completion of a first programming phase. The second CVD 403 includes a lobe 410 of erased storage elements and a lobe 412 of storage elements that have been programmed to an intermediate ("LM") state. Programming of storage elements to the LM state may be performed by applying one or more program voltage pulses to the storage elements, followed by performing a verify operation to determine whether the storage elements are activated when a first verify voltage (V1) 411 is applied to a control gate of the storage elements. Storage elements having a threshold voltage higher than the first verify voltage 411 may be isolated from further programming pulses, while storage elements that have not yet been programmed to the first verify voltage 411 may receive one or more additional programming pulses. Application of program voltages and verify operations may be repeated until each of the storage elements to be programmed to the LM state has a threshold voltage that exceeds the first verify voltage 411 (or until a number of applied program pulses has exceeded a program pulse limit).

A third CVD 405 illustrates threshold voltages of the storage elements after completion of a second programming phase. The third CVD 405 includes a first lobe 420 that corresponds to the erase state and represents the two-bit value '11', a second lobe 422 that corresponds to an "A" state and represents the two-bit value '10', a third lobe 424 that corresponds to a "B" state and represents the two-bit value '00', and a fourth lobe 426 that corresponds to a "C" state and represents the two-bit value '01'. State A is populated by programming selected storage elements from the erase state to have a threshold voltage that exceeds a second verify voltage (V2) 421. State B is populated by programming selected storage elements from the LM state to have a threshold voltage that exceeds a third verify voltage (V3) 423. State C is populated by programming selected storage elements from the LM state to have a threshold voltage that exceeds a fourth verify voltage (V4) 425.

A fourth CVD 407 illustrates threshold voltages of the storage elements after completion of a third programming phase. The fourth CVD 407 includes a first lobe 430 that corresponds to the erase state, a second lobe 432 that corresponds to state A, a third lobe 434 that corresponds to state B, and a fourth lobe 436 that corresponds to state C. State A is populated by programming selected storage elements from the lobe 422 to have a threshold voltage that exceeds a fifth verify voltage (V5) 431. State B is populated by programming selected storage elements from the lobe 422 to have a threshold voltage that exceeds a sixth verify voltage (V6) 433. State C is populated by programming selected storage elements from the lobe 424 to have a threshold voltage that exceeds a seventh verify voltage (V7) 435.

Thus, the first example 400 of the high-resolution write operation includes three programming phases, and each programming phases may include multiple iterations of applying one or more program pulses followed by a verify stage. The resulting CVD 407 has relatively narrow, spaced-apart lobes to enhance data integrity (e.g., to reduce errors due to aging, disturb effect, temperature, etc.) and enables storage of two bits of data per storage element.

In contrast to the first example 400 of the high-resolution write operation, a first example 440 of a low-resolution write operation includes a single programming phase. A CVD 441 illustrates a first lobe 450 corresponding to an erase state and a second lobe 452 corresponding to an LM state. The programming phase may use similar program pulses and verify operations as the first programming phase of the high-resolution write operation. However, instead of using the first verify voltage (V1) 411 of the first phase of the high-resolution write operation, the LM state is programmed using the seventh verify voltage (V7) of the third phase of the high-resolution write operation.

The CVD 441 illustrates "low-resolution" programming as compared to the "high-resolution" programming of the CVD 407 at least partially due to wider lobes in the "low-resolution" CVD 441. For example, the lobe 436 in the CVD 407 spans a first voltage range 480, and the lobe 452 in the CVD 441 spans a second voltage range 482 that is larger than the first voltage range 480.

Although the first example 400 of a high-resolution write operation includes three programming phases and the first example 440 of a low-resolution write operation includes a single programming phase, in other implementations other numbers of programming phases may be used. To illustrate, a low-resolution write operation (e.g., corresponding to a write operation of the burn-in sequence 121) may have a first number "x" of programming phases, and a high-resolution write operation (e.g., corresponding to a write operation of the block test sequence 171) may have a second number "y" of programming phases, where y is greater than x.

A second example 460 of a "high-resolution" write operation illustrates a series of programming pulses applied to storage elements as a function of time. A first programming pulse has a first programming voltage 462, and a second programming pulse has a voltage that is greater than the first programming voltage by a first programming pulse voltage step size 464. Each subsequent programming pulse may have a voltage that exceeds the voltage of the previous programming pulse by the first programming pulse voltage step size 464. A first set of verify stages 466 illustrates a verify stage performed after application of each of the programming pulses. By having a relatively low programming voltage 462, a relatively small step size 464, and relatively frequent verify stages 466, the high-resolution write operation may result in relatively narrow lobes in a resulting CVD.

A second example 470 of a low-resolution write operation illustrates a series of fewer, larger programming pulses as compared to the high-resolution write operation. For example, a first programming pulse has a second programming voltage 472 that is larger than the first programming voltage 462. In addition, a second programming pulse voltage step size 474 may be larger than the step size 464. As illustrated, a second set of verify stage(s) 476 illustrates a verify stage performed after multiple programming pulses have been applied, as compared to after every programming pulse as in the high-resolution write operation. By having a relatively large programming voltage 472, a relatively large step size 464, fewer programming pulses, and less frequent verify stages, the low-resolution write operation may be completed more quickly than the high-resolution write operation and may result in relatively wide lobes in a resulting CVD.

FIG. 4 thus depicts several examples of techniques that can be used individually or in combination to complete a first data write operation of a burn-in test sequence more quickly than a second data write operation of a block test sequence. For example, the first data write operation may include a first number "u" of verify stages, and the second data write operation may include a second number "v" of verify stages, where v is larger than u. In some implementations, the first data write operation may not include any verify operations (e.g., u=0) and may instead apply a series of programming pulses without verifying a final program state of any of the storage elements. As other examples, the first data write operation may include one or more of the described techniques, such as by including at least one of: fewer programming pulses than the second data write operation, a higher programming voltage than the second data write operation, or a larger programming pulse voltage step size than the second data write operation. Use of one or more of the described techniques enables burn-in testing to be performed with reduced latency as compared to using conventional write operations.

Figure 5:
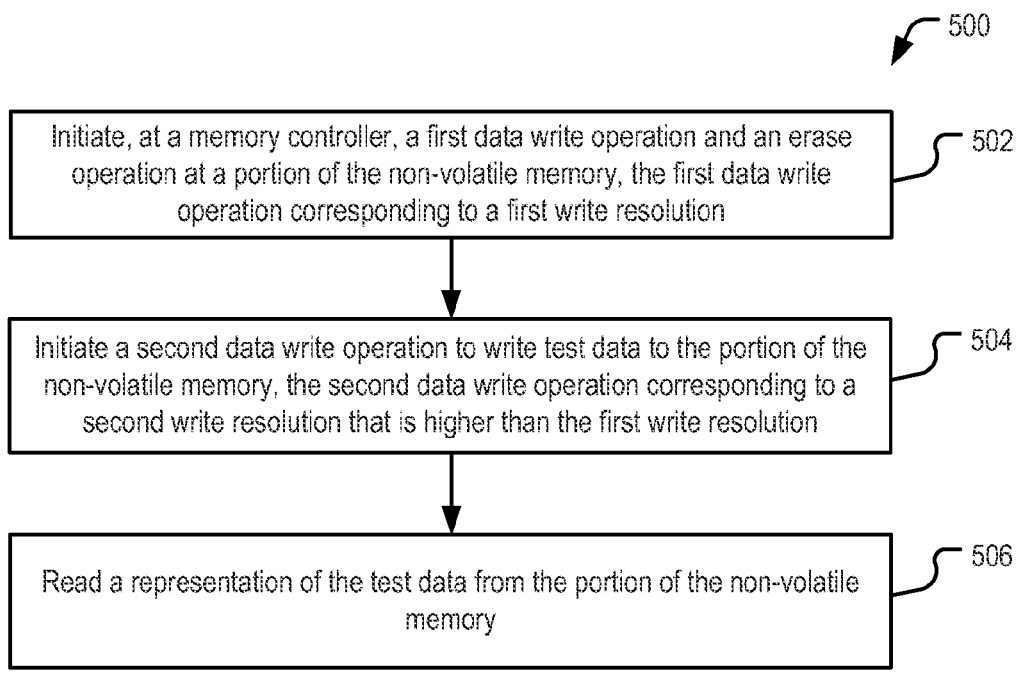
FIG. 5 is a flowchart of a particular illustrative example of a method of performing a burn-in memory test that may be performed by the data storage device of FIG. 1.

Referring to FIG. 5, a particular illustrative example of a method of testing a memory is depicted and generally designated 500. The method 500 may be performed at a device that includes a non-volatile memory and a controller. For example, the device may include or correspond to the data storage device 102.

The method 500 includes initiating, by the controller, a first data write operation and an erase operation on a portion of the non-volatile memory, at 502. The first data write operation corresponds to a first write resolution. The first data write operation may write data to the portion of the non-volatile memory, and the data may be erased at the portion without the data being read from the portion. For example, the first data write operation may be performed during a burn-in testing procedure that includes performing multiple write operations corresponding to the first write resolution at the portion of the non-volatile memory before initiating the second data write operation, such as described with respect to the burn-in test sequence 121 of FIG. 1 or the burn-in test sequence 310 of FIG. 3. The first data write operation may be performed responsive to the first data write command 122 of FIG. 1 or responsive to the burn-in test command 390 of FIG. 3, as illustrative, non-limiting examples.

A second data write operation is initiated by the controller to write test data to the portion of the non-volatile memory, at 504. The second data write operation corresponds to a second write resolution that is greater than the first write resolution. For example, the controller 130 may send the second write command 172 and the test data 174 of FIG. 1 to initiate the second data write operation.

A representation of the test data is read from the portion of the non-volatile memory, at 506. A determination may be made as to whether the portion is to be marked for non-use at least partially based on the representation of the test data. For example, the burn-in test module 138 may determine whether to add an indicator of the portion to the bad block list 132 based on a number of errors in the representation 178 that are detected by the ECC engine 134.

The first data write operation may correspond to a "low-resolution" write operation and the second data write operation may correspond to a "high-resolution" write operation, such as described with respect to FIG. 4. For example, the first data write operation may include a first number of programming phases (e.g., one phase as in the example 440 of FIG. 4), and the second data write operation may include a second number of programming phases (e.g., three phases as in the example 400 of FIG. 4) that is greater than the first number of programming phases. As another example, the first data write operation may include at least one of: fewer programming pulses than the second data write operation, such as illustrated in the examples 400 and 440 of FIG. 4, a higher programming voltage than the second data write operation, or a larger programming pulse voltage step size than the second data write operation, such as illustrated in the examples 460 and 470 of FIG. 4.

Performing the first data write operation using a lower resolution than the second data write operation enables burn-in testing to be performed more quickly than if higher resolution data write operations were used. As a result, burn-in testing may be performed by the controller of a data storage device, such as in response to detecting a first-time mount, with reduced latency and reduced impact on a user experience. Performing burn-in testing "in the field" instead of as part of a manufacturing process reduces a time and cost of manufacture of the data storage device.

Figure 6:
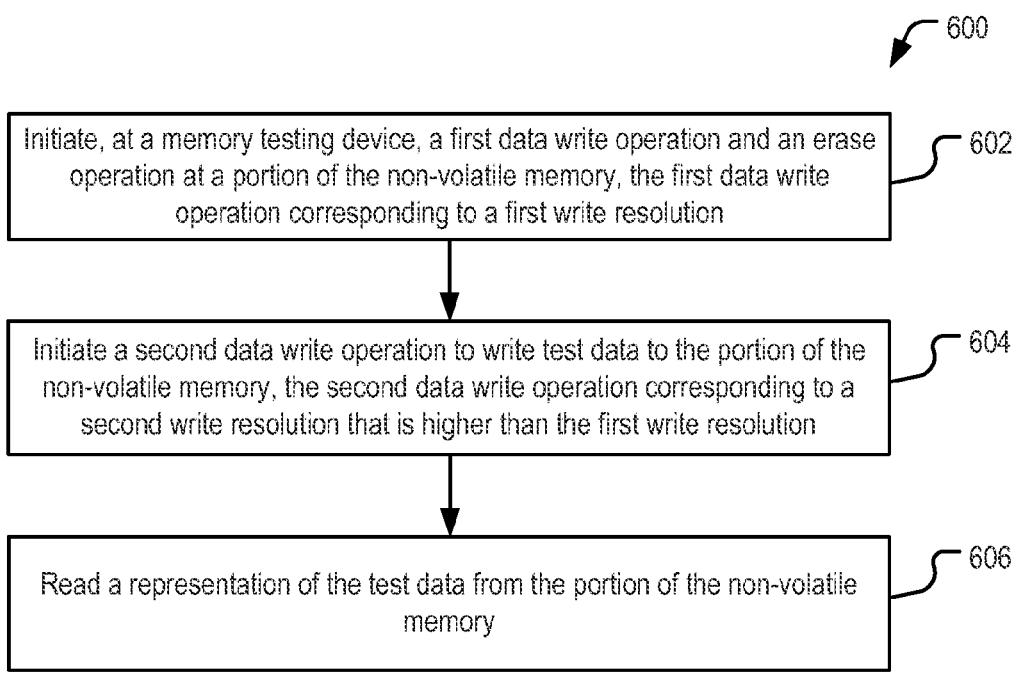
FIG. 6 is a flowchart of a particular illustrative example of a method of performing a burn-in memory test that may be performed by the memory tester of FIG. 2.

Referring to FIG. 6, another illustrative example of a method of testing a memory is depicted and generally designated 600. The method 600 may be performed at a memory testing device that includes a testing controller and a memory interface, such as the memory tester 202 of FIG. 2, while the memory interface is coupled to a wafer or die that includes a non-volatile memory, such as the memory device 203 of FIG. 2.

The method 600 includes initiating, by the testing controller, a first data write operation and an erase operation to be performed on a portion of the non-volatile memory, at 602. The first data write operation corresponds to a first write resolution. The first data write operation may be performed during a burn-in testing procedure that includes performing multiple write operations corresponding to the first write resolution at the portion of the non-volatile memory, such as described with respect to the burn-in sequence 121 of FIG. 2 or the burn-in sequence 310 of FIG. 3, before initiating the second data write operation. The first data write operation may be responsive to the first data write command 122 of FIG. 2 or responsive to the burn-in test command 390 of FIG. 3, as illustrative, non-limiting examples.

A second data write operation is initiated by the testing controller to write test data to the portion of the non-volatile memory, at 604. The second data write operation corresponds to a second write resolution that is higher than the first write resolution. For example, the second data write operation may be responsive to the second data write command 172 of FIG. 2.

A representation of the test data is read from the portion of the non-volatile memory, at 606. A determination may be made as to whether the portion is to be marked for non-use at least partially based on the representation of the test data. For example, the burn-in test module 138 may determine whether to add the portion to the bad block list 132 based on a number of errors in the representation 178 that are detected by the ECC engine 134 of FIG. 2.

The method 600 may also include performing one or more of a sense amplifier testing operation, a latch testing operation, or a leakage testing operation of the non-volatile memory. For example, the sense amplifier testing operation may be performed by the sense amplifier testing module 232, the latch testing operation may be performed by the latch testing module 234, and the leakage testing operation may be performed by the leakage testing module 236 of FIG. 2.

Because the first write resolution of the first data write operation is lower than the second write resolution of the second data write operation, burn-in testing may be performed more quickly than burn-in testing that uses the higher write resolution. Performing burn-in testing at the memory tester may therefore reduce a cost and delay associated with performing burn-in testing.

Figure 7:
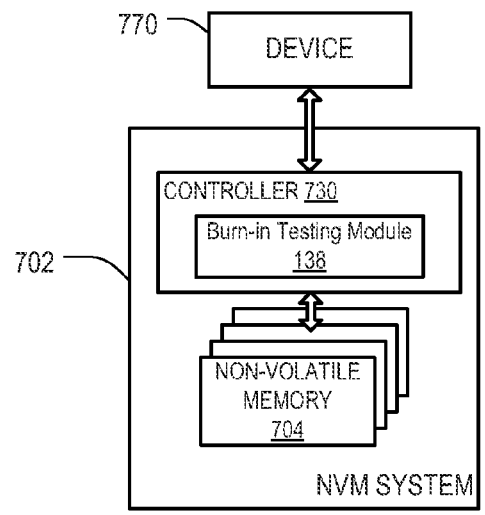
FIG. 7 is a block diagram of a particular illustrative embodiment of a non-volatile memory system.

Referring to FIG. 7, a non-volatile memory system 702 (e.g., the data storage device 102) may be coupled to a device 770 (e.g., the accessing device 160 of FIG. 1). The non-volatile memory system 702 includes a controller 730 (e.g., the controller 130 of FIG. 1) and non-volatile memory that may be made up of one or more non-volatile memory dies 704 (e.g., one or more memory dies included in the memory device 103 of FIG. 1). As used herein, the term "memory die" refers to the collection of non-volatile memory cells, and associated circuitry for managing the physical operation of those non-volatile memory cells, that are formed on a single semiconductor substrate. The controller 730 interfaces with the device 770 and transmits command sequences for read, program, and erase operations to the one or more non-volatile memory dies 704. The controller 730 includes the burn-in testing module 138.

The controller 730 (which may be a flash memory controller) may take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 730 may be configured with hardware and/or firmware to perform the various functions described below and shown in the flow diagrams. Also, some of the components shown as being internal to the controller 730 can be stored external to the controller 730, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when a host device is to read data from or write data to the flash memory, the host device communicates with the flash memory controller. If the host device provides a logical address to which data is to be read/written, the flash memory controller can convert the logical address received from the host device to a physical address in the flash memory. (Alternatively, the host device can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The one or more non-volatile memory dies 704 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller 730 and the one or more non-volatile memory dies 704 may be any suitable flash interface, such as Toggle Mode. In one embodiment, the non-volatile memory system 702 may be a card based system, such as a secure digital (SD) or a micro secure digital (micro-SD) card. In an alternate embodiment, the non-volatile memory system 702 may be part of an embedded memory system.

Although, in the example illustrated in FIG. 7, the non-volatile memory system 702 (sometimes referred to herein as a storage module) includes a single channel between the controller 730 and the one or more non-volatile memory dies 704, the subject matter described herein is not limited to having a single memory channel. For example, in some NAND memory system architectures (such as the ones shown in FIGS. 8 and 9), 2, 4, 8 or more NAND channels may exist between the controller 730 and the NAND memory device, depending on controller capabilities. In any of the embodiments described herein, more than a single channel may exist between the controller 730 and the one or more non-volatile memory dies 704, even if a single channel is shown in the drawings.

Figure 8:
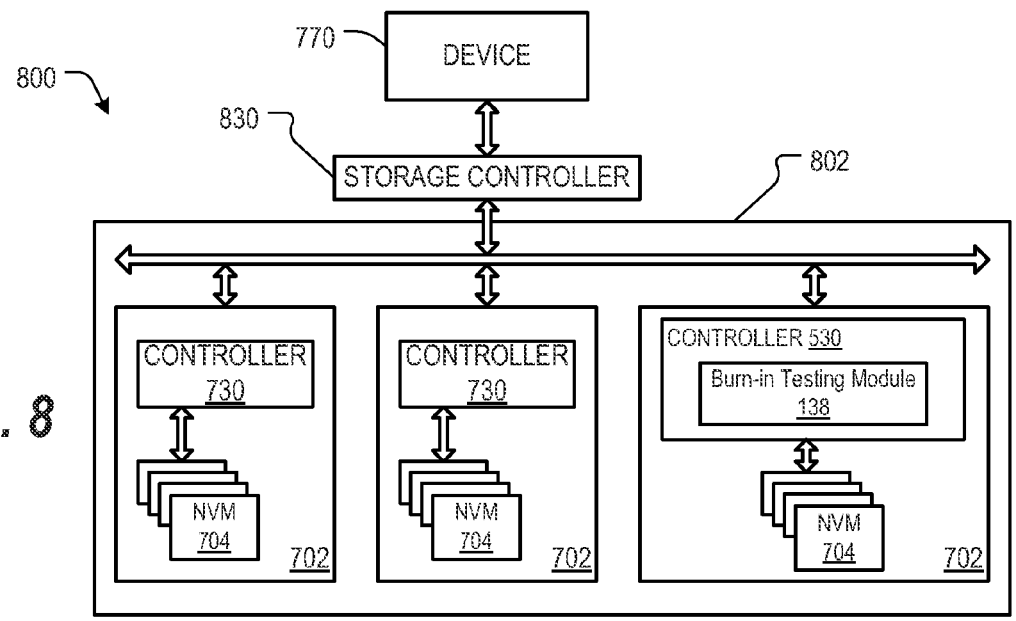
FIG. 8 is a block diagram of a particular illustrative embodiment of a storage system including a plurality of the non-volatile memory systems of FIG. 7.

FIG. 8 illustrates a storage system 800 that includes multiple non-volatile memory systems 702. As such, storage system 800 may include a storage controller 830 that interfaces with the device 770 (e.g., a host device) and with a storage system 802, which includes a plurality of non-volatile memory systems 702. The interface between the storage controller 830 and the non-volatile memory systems 702 may be a bus interface, such as a serial advanced technology attachment (SATA) or peripheral component interface express (PCIe) interface. The storage system 1000 may correspond to a solid state drive (SSD), such as found in portable computing devices, such as laptop computers, and tablet computers. One or more of the controllers 730 of FIG. 8 may include a burn-in testing module corresponding to the burn-in testing module 138. The storage controller 830 may include a burn-in testing module corresponding to the burn-in testing module 138.

Figure 9:
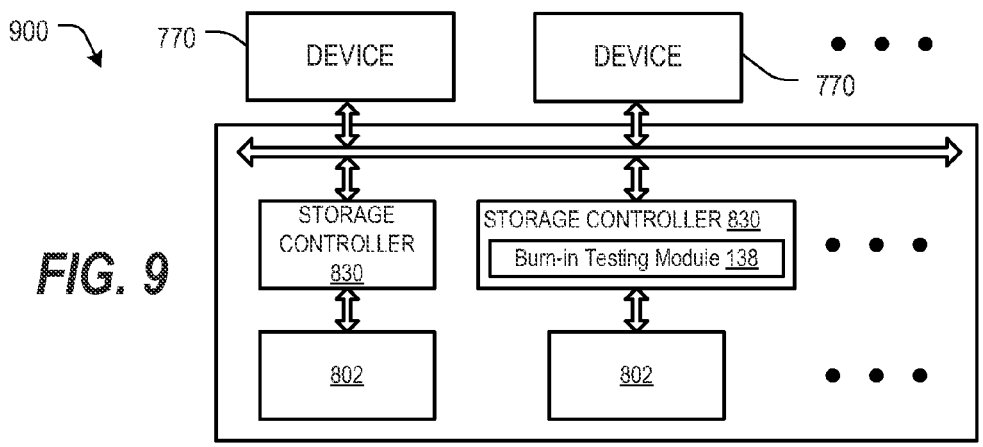
FIG. 9 is a block diagram of a particular illustrative embodiment of a hierarchical storage system.

FIG. 9 is a block diagram illustrating a hierarchical storage system 900. The hierarchical storage system 900 includes a plurality of storage controllers 830, each of which controls a respective storage system 802. Devices 770 (e.g., one or more host devices or accessing devices) may access memories within the hierarchical storage system 900 via a bus interface. In one embodiment, the bus interface may be an NVMe or fiber channel over Ethernet (FCoE) interface. In one embodiment, the hierarchical storage system 900 illustrated in FIG. 9 may be a rack mountable mass storage system that is accessible by multiple host computers, such as would be found in a data center or other location where mass storage is needed. One or more storage controllers 830 of FIG. 9 may include a burn-in testing module corresponding to the burn-in testing module 138.

Figure 10:
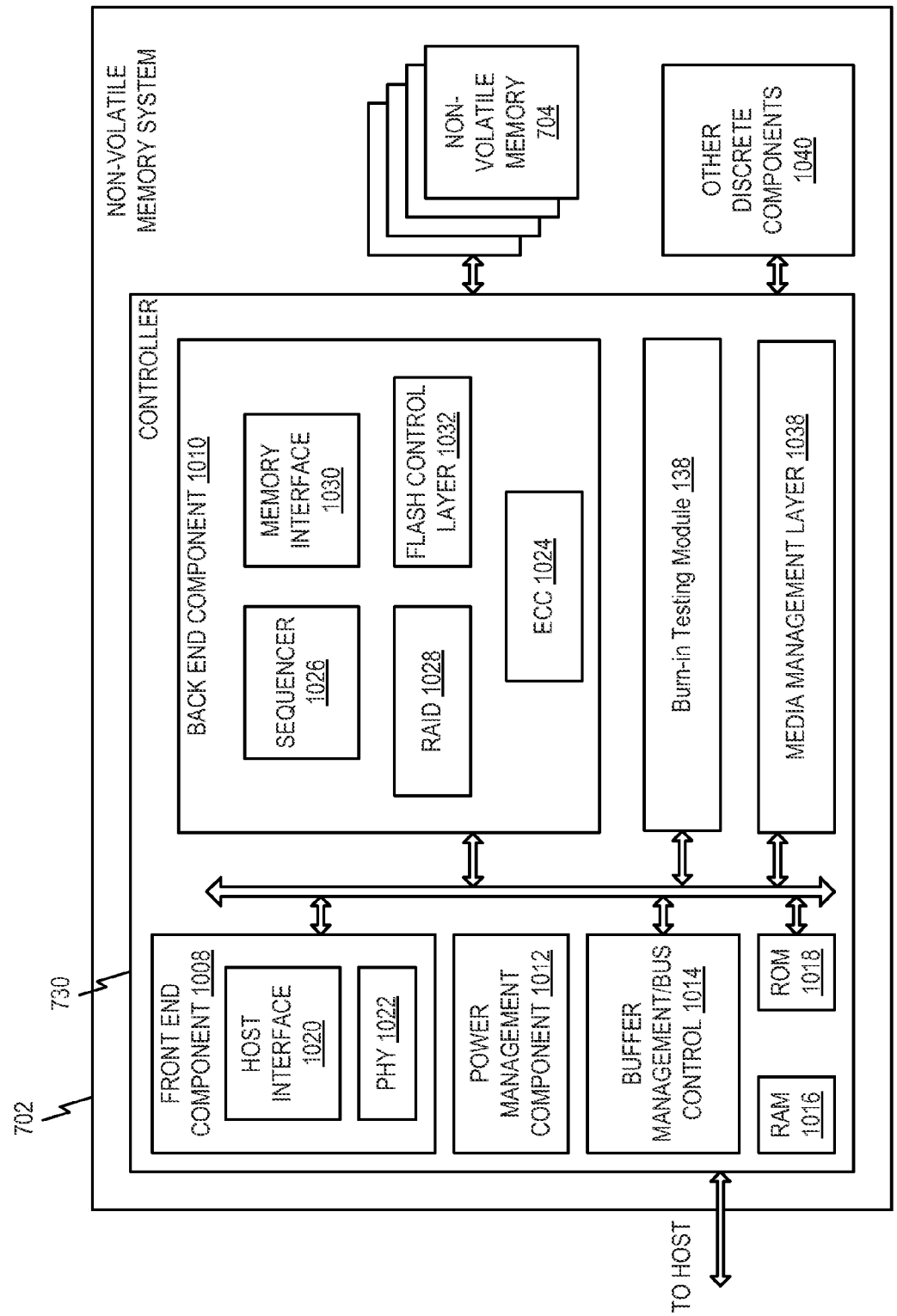
FIG. 10 is a block diagram of components of a particular illustrative embodiment of a controller.

FIG. 10 is a block diagram illustrating exemplary components of the controller 730 of the non-volatile memory system 702 in more detail. The controller 730 includes the burn-in testing module 138. The controller 730 also includes a front end component 1008 that interfaces with a host device, a back end component 1010 that interfaces with the one or more non-volatile memory dies 704, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to the controller 730, a buffer manager/bus controller 1014 manages buffers in random access memory (RAM) 1016 and controls the internal bus arbitration of the controller 730. A read only memory (ROM) 1018 stores system boot code. Although illustrated in FIG. 10 as located within the controller 730, in other embodiments one or both of the RAM 1016 and the ROM 1018 may be located externally to the controller 730. In yet other embodiments, portions of RAM and ROM may be located both within the controller 730 and outside the controller 730.

Front end component 1008 includes a host interface 1020 and a physical layer interface (PHY) 1022 that provide the electrical interface with the host device or next level storage controller. The choice of the type of host interface 1020 can depend on the type of memory being used. Examples of host interfaces 1020 include, but are not limited to, SATA, SATA Express, SAS, Fibre Channel, USB, PCIe, and NVMe. The host interface 1020 typically facilitates transfer for data, control signals, and timing signals.

Back end component 1010 includes an error correcting code (ECC) engine 1024 that encodes the data received from the host device, and decodes and error corrects the data read from the non-volatile memory, such as the representation 178 of the test data 174 of FIG. 1. A command sequencer 1026 generates command sequences, such as program and erase command sequences, to be transmitted to the one or more non-volatile memory dies 704. A RAID (Redundant Array of Independent Drives) component 1028 manages generation of RAID parity and recovery of failed data. The RAID parity may be used as an additional level of integrity protection for the data being written into the one or more non-volatile memory dies 704. In some cases, the RAID component 1028 may be a part of the ECC engine 1024. A memory interface 1030 provides the command sequences to non-volatile memory die 704 and receives status information from the one or more non-volatile memory dies 704. For example, the memory interface 1030 may be a double data rate (DDR) interface, such as a Toggle Mode interface. A flash control layer 1032 controls the overall operation of back end component 1010.

Additional components of the non-volatile memory system 702 illustrated in FIG. 10 include a power management component 1012 and a media management layer 1038, which performs wear leveling of memory cells of the one or more non-volatile memory dies 704. The non-volatile memory system 702 may also include one or more other components illustrated with reference to FIGS. 1-3, such as the control circuitry 305 of FIG. 3, as an illustrative example. Non-volatile memory system 702 also includes other discrete components 1040, such as external electrical interfaces, external RAM, resistors, capacitors, or other components that may interface with the controller 730. In alternative embodiments, one or more of the physical layer interface 1022, RAID component 1028, media management layer 1038 and buffer management/bus controller 1014 are optional components that are omitted from the controller 730.

Figure 11:
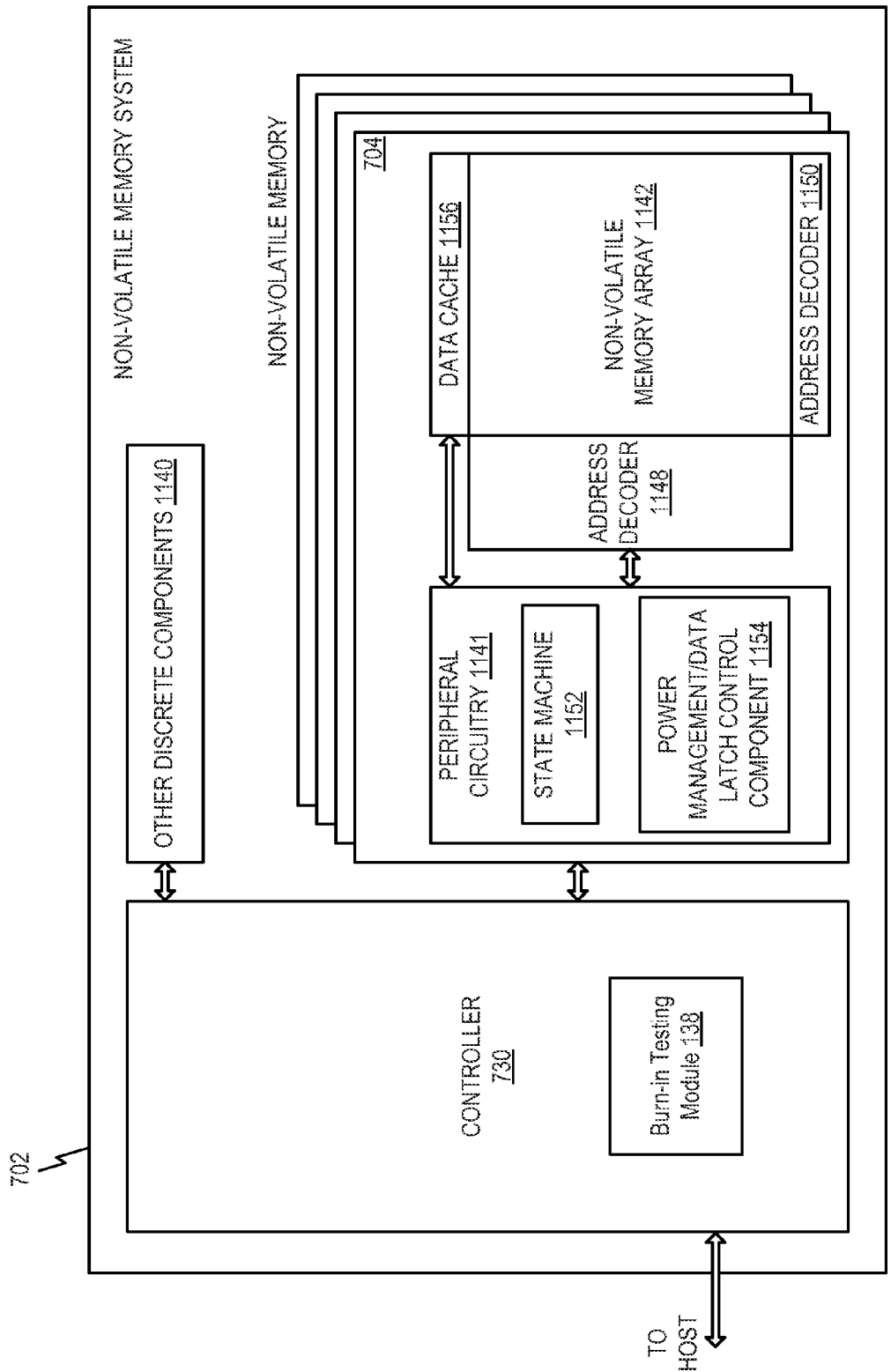
FIG. 11 is a block diagram of components of a particular illustrative embodiment of a non-volatile memory die.

FIG. 11 is a block diagram illustrating exemplary components of the one or more non-volatile memory dies 704 of the non-volatile memory system 702 in more detail. The one or more non-volatile memory dies 704 include peripheral circuitry 1141 and a non-volatile memory array 1142. The non-volatile memory array 1142 includes the non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry 1141 includes a state machine 1172 that provides status information to the controller 730, which may include the burn-in testing module 138. The peripheral circuitry 1141 may also include a power management or data latch control component 1174. The one or more non-volatile memory dies 704 further include discrete components 1140, an address decoder 1148, an address decoder 1150, and a data cache 1156 that caches data.

The burn-in testing module 138 may be configured to send one or more instructions of the burn-in sequence 121 of FIG. 1 to the one or more non-volatile memory dies 704. The burn-in testing module 138 may be configured to identify one or more blocks of the one or more non-volatile memory dies 704 to be unused. For example, the burn-in testing module 138 may be configured to cause a burn-in sequence of low-resolution write commands and erase commands to be performed at blocks of the one or more non-volatile memory dies 704 and to detect when a number of errors occurring in test data that is written using a high-resolution write exceeds a threshold.

Although various components of the data storage device 102, such as the burn-in testing module 138 or the ECC engine 134, and/or the accessing device 160 of FIG. 1 are depicted herein as block components and described in general terms, such components may include one or more physical components, such as hardware controllers, one or more microprocessors, state machines, logic circuits, one or more other structures, other circuits, or a combination thereof configured to enable the various components to perform operations described herein.

Components described herein may be operationally coupled to one another using one or more nodes, one or more buses (e.g., data buses and/or control buses), one or more other structures, or a combination thereof. One or more aspects of the various components may be implemented using a microprocessor or microcontroller programmed to perform operations described herein, such as one or more operations of the method 500 of FIG. 5 or one or more operations of the method 600 of FIG. 6.

Alternatively or in addition, one or more aspects of the data storage device 102 and/or the memory tester 202, such as the burn-in testing module 138 or the ECC engine 134, and/or the accessing device 160 of FIG. 1 may be implemented using a microprocessor or microcontroller programmed (e.g., by executing instructions) to perform operations described herein, such as one or more operations of the method 500 of FIG. 5, the method 600 of FIG. 6, or a combination thereof, as described further herein. In some implementations, each of the controller 130, memory tester 202, the memory device 103, and/or the accessing device 160 may include a processor executing instructions that are stored at a memory, such as a non-volatile memory of the data storage device 102, of the memory tester 202, or of the accessing device 160 of FIG. 1. Alternatively or additionally, executable instructions that are executed by the processor may be stored at a separate memory location that is not part of the non-volatile memory, such as at a read-only memory (ROM) of the data storage device 102 or the accessing device 160 of FIG. 1 or the memory tester 202 of FIG. 2.

With reference to FIG. 1, the data storage device 102 may be attached to or embedded within one or more accessing devices, such as within a housing of the accessing device 160. For example, the data storage device 102 may be embedded within the accessing device 160 in accordance with a Joint Electron Devices Engineering Council (JEDEC) Solid State Technology Association Universal Flash Storage (UFS) configuration. To further illustrate, the data storage device 102 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory. However, in other implementations, the data storage device 102 may be implemented in a portable device configured to be selectively coupled to one or more external accessing devices. For example, the data storage device 102 may be removable from the accessing device 160 (i.e., "removably" coupled to the accessing device 160). As an example, the data storage device 102 may be removably coupled to the accessing device 160 in accordance with a removable universal serial bus (USB) configuration. In still other implementations, the data storage device 102 may be a component (e.g., a solid-state drive (SSD)) of a network accessible data storage system, such as an enterprise data system, a network-attached storage system, a cloud data storage system, etc.

The memory 104 may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104 may include another type of memory. In some implementations, one or more of the memory 104 may include a semiconductor memory device.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some implementations include a resistivity switching storage element, such as an anti-fuse, phase change material, etc., and optionally a steering element, such as a diode, etc. Further by way of non-limiting example, active semiconductor memory elements include EEPROM and flash memory device elements, which in some implementations include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the examples described herein are intended to provide a general understanding of the various aspects of the disclosure. Other implementations may be utilized and derived from the disclosure, such that structural and logical substitutions and changes may be made without departing from the scope of the disclosure. This disclosure is intended to cover any and all subsequent adaptations or variations of various implementations. Those of skill in the art will recognize that such modifications are within the scope of the present disclosure.

The above-disclosed subject matter is to be considered illustrative, and not restrictive, and the appended claims are intended to cover all such modifications, enhancements, and other implementations, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   circuitry configured to perform a first data write operation corresponding to a first cell voltage distribution having a first lobe, in a corresponding number-of-cells versus cell-voltage plot, that spans a different voltage range than a corresponding lobe of a second cell voltage distribution corresponding to a second data write operation configured to write test data to a portion of a non-volatile memory; and
   a controller comprising a burn-in tester and configured to read a representation of the test data from the portion of the non-volatile memory, the burn-in tester configured to:
      initiate the first data write operation and an erase operation as part of a burn-in test sequence; and
      initiate a memory initialization test that includes performance of the first data write operation, the erase operation, and the second data write operation on the portion of the non-volatile memory.

2. The data storage device of claim 1, wherein the first cell voltage distribution includes multiple lobes spanning larger voltage ranges as compared to lobes of the second cell voltage distribution.

3. The data storage device of claim 1, wherein:
   the first cell voltage distribution corresponds to a first write resolution,
   the first lobe spans a first voltage range,
   the second cell voltage distribution corresponds to a second write resolution and includes a second lobe, and
   the second lobe spans a second voltage range smaller than the first voltage range.

4. The data storage device of claim 1, wherein the first data write operation corresponds to a first write resolution that is less than a second data write resolution that corresponds to the second data write operation, and wherein the burn-in tester is further configured to generate commands to perform multiple write operations corresponding to the first write resolution at the portion of the non-volatile memory before initiating the second data write operation.

5. The data storage device of claim 1, wherein the first data write operation is configured to write data to the portion of the non-volatile memory, and wherein the data is erased at the portion of the non-volatile memory without the data being read from the portion of the non-volatile memory.

6. The data storage device of claim 1, wherein the first data write operation includes a first number of programming phases, and wherein the second data write operation includes a second number of programming phases, the second number greater than the first number.

7. The data storage device of claim 1, wherein the first data write operation includes a first number of verify stages, and wherein the second data write operation includes a second number of verify stages, the second number greater than the first number.

8. The data storage device of claim 7, wherein the first number is zero.

9. The data storage device of claim 1, wherein the first data write operation includes at least one of:
   fewer programming pulses than the second data write operation;
   a higher programming voltage than the second data write operation; or
   a larger programming pulse voltage step size than the second data write operation.

10. The data storage device of claim 1, wherein the portion of the non-volatile memory includes a block, and wherein the first data write operation programs storage elements coupled to multiple word lines in the block concurrently.

11. The data storage device of claim 10, wherein the first data write operation includes simultaneous programming of all storage elements in the block using a single verify level.

12. The data storage device of claim 10, further comprising a bad block list, wherein the second data write operation writes test data to the block, and wherein the controller is further configured to add the block to the bad block list at least partially based on a number of errors in a representation of the test data read from the block.

13. The data storage device of claim 1, wherein the controller is further configured to read a representation of the test data from the portion of the non-volatile memory.

14. The data storage device of claim 13, wherein the controller is further configured to initiate the burn-in test sequence in response to detecting a first-time mount of the data storage device.

15. The data storage device of claim 1, wherein:
   the controller is further configured to read a representation of the test data as part of a block test sequence, and
   an error correction coding (ECC) engine included in the controller is configured to determine a number of errors in the representation of the test data.

16. The data storage device of claim 1, wherein the circuitry includes:
first circuitry configured to enable the first data write operation at the non-volatile memory using a first write resolution; and
second circuitry configured to enable the second data write operation at the non-volatile memory using a second write resolution that is greater than the first write resolution.

17. The data storage device of claim 1, further comprising at least one of a memory interface or a controller interface, the memory interface included in the controller and coupled to the non-volatile memory, and the controller interface included in the non-volatile memory and coupled to the controller.

18. A method performed by a controller, the method comprising:
initiating, by a testing circuit, a first data write operation and an erase operation on a portion of a non-volatile memory as part of a testing procedure, the first data write operation corresponding to a first cell voltage distribution having a first lobe, in a corresponding number-of-cells versus cell-voltage plot, that spans a different voltage range than a corresponding lobe of a second cell voltage distribution corresponding to a second data write operation initiated to write test data to the portion of the non-volatile memory, the testing circuit configured to initiate a memory initialization test that includes the first data write operation, the erase operation, and the second data write operation; and
reading a representation of the test data from the portion of the non-volatile memory.

19. The method of claim 18, wherein the first data write operation corresponds to a first write resolution less than a second data write resolution that corresponds to the second data write operation, and wherein first data write operation is performed during a burn-in testing procedure that includes performing multiple write operations corresponding to the first write resolution at the portion of the non-volatile memory before initiating the second data write operation.

20. The method of claim 18, wherein the first cell voltage distribution includes multiple lobes spanning larger voltage ranges as compared to lobes of the second cell voltage distribution, and further comprising determining whether the portion is to be marked for non-use at least partially based on the representation of the test data.

21. The method of claim 18, wherein:
the first data write operation writes data to the portion of the non-volatile memory, the data is erased at the portion without the data being read from the portion,
the second data write operation writes the test data to the portion of the non-volatile memory, and
the first lobe corresponding to the first data write operation spans a larger voltage range than the corresponding lobe of the second data write operation.

22. The method of claim 18, wherein the first data write operation includes a first number of programming phases, and wherein the second data write operation includes a second number of programming phases, the second number greater than the first number.

23. The method of claim 18, wherein the first data write operation includes at least one of:
fewer programming pulses than the second data write operation;
a higher programming voltage than the second data write operation; or
a larger programming pulse voltage step size than the second data write operation.

24. The method of claim 18, wherein a program/erase (P/E) counter corresponding to the portion is incremented responsive to at least one of the first data write operation or the erase operation.

25. The method of claim 18, wherein the controller is included in a memory testing device that is coupled to a wafer or a die that includes the non-volatile memory, and further comprising performing one or more of a sense amplifier testing operation, a latch testing operation, or a leakage testing operation of the non-volatile memory.

26. A memory testing device comprising:
a memory interface configured to be coupled to a die or a wafer that includes a non-volatile memory; and
a testing controller comprising a burn-in tester and configured to read a representation of test data from a portion of the non-volatile memory, the burn-in tester configured to:
initiate a first data write operation and an erase operation as part of a burn-in test sequence; and
initiate a memory initialization test that includes performance of the first data write operation, the erase operation, and a second data write operation configured to write the test data to the portion of the non-volatile memory, the first data write operation corresponding to a first cell voltage distribution having a first lobe, in a corresponding number-of-cells versus cell-voltage plot, that spans a different voltage range than a corresponding lobe of a second cell voltage distribution corresponding to the second data write operation.

27. The memory testing device of claim 26, wherein the first data write operation corresponds to a first write resolution less than a second write resolution that corresponds to the second data write operation, and wherein the burn-in tester is further configured to generate commands to perform multiple write operations corresponding to the first write resolution at the portion of the non-volatile memory before initiating the second data write operation.

28. The memory testing device of claim 26, wherein the first lobe corresponding to the first data write operation spans a larger voltage range than the corresponding lobe of the second data write operation, and wherein the testing controller includes one or more of a sense amplifier testing module, a latch testing module, or a leakage testing module.

29. The memory testing device of claim 26, further comprising a bad block list, wherein the portion corresponds to a block, wherein the second data write operation writes test data to the block, and wherein the testing controller is further configured to add an identifier of the block to the bad block list at least partially based on a number of errors in a representation of the test data read from the block.

30. The memory testing device of claim 26, wherein the first cell voltage distribution includes multiple lobes spanning larger voltage ranges as compared to lobes of the second cell voltage distribution.

31. The memory testing device of claim 26, wherein the testing controller is further configured to read a representation of the test data as part of a block test sequence.

32. The memory testing device of claim 26, wherein the testing controller includes an error correction coding (ECC) engine configured to determine a number of errors in a representation of test data generated based on the second data write operation.

33. A device comprising:
a non-volatile memory;
a controller interface configured to enable a memory controller to read a representation of test data from a portion of the non-volatile memory; and
control circuitry coupled to the controller interface and to the non-volatile memory, wherein the control circuitry is configured to perform at least one memory access operation in response to receiving a burn-in test command from the memory controller via the controller interface, the at least one memory access operation including at least one of a first memory access operation and a second memory access operation, the first memory access operation configured to generate a first cell voltage distribution having a first lobe in a corresponding number-of-cells versus cell-voltage plot, the first lobe spanning a different voltage range than a corresponding lobe of a second cell voltage distribution corresponding to the second memory access operation.

34. The device of claim 33, wherein the first memory access operation includes a first write operation that corresponds to a first write resolution less than a second write resolution that corresponds to a second write operation included in the second memory access operation, and wherein the control circuitry is further configured to perform a sequence of write operations and erase operations to the portion of the non-volatile memory in response to receiving the burn-in test command.

35. The device of claim 33, wherein the first memory access operation includes a low-resolution write operation, and wherein the control circuitry is further configured to repeat the low-resolution write operation and an erase operation on the portion of the non-volatile memory until a counter value equals a threshold.

36. The device of claim 33, further comprising circuitry configured to perform the at least one memory access operation as a first data write operation corresponding to a first write resolution and to perform a test data write operation corresponding to a second write resolution that is greater than the first write resolution.

37. The device of claim 33, wherein the at least one memory access operation further includes:
a block write operation that concurrently programs all storage elements of a block; and
a test data write operation.

38. The device of claim 33, further comprising a program/erase (P/E) counter corresponding to the portion of the non-volatile memory, wherein the P/E counter is incremented responsive to the at least one memory access operation.

39. The device of claim 33, wherein the non-volatile memory includes a first plane having first blocks and further includes a second plane having second blocks, wherein the burn-in test command identifies a block of the first blocks or of the second blocks, and wherein the at least one memory access operation is performed at the identified block.

40. The device of claim 33, wherein the at least one memory access operation further includes a first write operation and a second write operation associated with the first cell voltage distribution and the second cell voltage distribution, respectively, the first cell voltage distribution including a lobe spanning a larger voltage range than a corresponding lobe of the second cell voltage distribution.

41. An apparatus comprising:
means for performing a first write operation corresponding to a first cell voltage distribution having a first lobe, in a corresponding number-of-cells versus cell-voltage plot, that spans a different voltage range than a corresponding lobe of a second cell voltage distribution corresponding to a second write operation configured to write test data to a portion of means for storing data; and
means for controlling the means for storing data, the means for controlling configured to read a representation of the test data from the portion of the means for storing data and comprising means for performing burn-in testing, the means for performing burn-in testing configured to:
initiate the first write operation and an erase operation as part of a burn-in test sequence; and
initiate an initialization test that includes performance of the first write operation, the erase operation, and the second write operation on the portion of the means for storing data.

42. The apparatus of claim 41, wherein the first write operation corresponds to a first write resolution that is less than a second write resolution that corresponds to the second write operation.

* * * * *